United States Patent [19]

Kidd

[11] Patent Number: 4,828,877
[45] Date of Patent: May 9, 1989

[54] ELECTRICAL CIRCUIT

[75] Inventor: Jonathan Kidd, Essex, United Kingdom

[73] Assignee: The General Electric Company, p.l.c., Essex, United Kingdom

[21] Appl. No.: 137,142

[22] Filed: Dec. 23, 1987

[30] Foreign Application Priority Data

Dec. 23, 1986 [GB] United Kingdom ................ 8630831

[51] Int. Cl.⁴ .......................................... B05D 5/12
[52] U.S. Cl. ................................. 427/96; 427/123; 427/264; 427/271; 427/372.2; 427/383.5
[58] Field of Search ............. 427/96, 123, 372.2, 427/383.5, 264, 271

[56] References Cited

U.S. PATENT DOCUMENTS

| 4,343,833 | 8/1982 | Sawae | 427/123 |
| 4,430,365 | 2/1984 | Schaible | 427/96 |
| 4,624,864 | 11/1986 | Hartmann | 427/96 |
| 4,629,681 | 12/1986 | Takada | 427/96 |

*Primary Examiner*—Shrive Beck
*Assistant Examiner*—Vi Duong Dang
*Attorney, Agent, or Firm*—Lowe, Price, LeBlanc Becker & Shur

[57] ABSTRACT

An electrical circuit arrangement includes a conductive link through an insulating layer separating two conductive layers. This link is formed by placing an evaporable plug on a first conductive layer, forming the insulating layer around it and then vaporising the plug. The resulting gap is then infilled with conductive material and a second conductive layer formed on the insulating layer.

11 Claims, 4 Drawing Sheets

ELECTRICAL CIRCUIT

FIELD OF THE INVENTION

This invention relates to the formation of electrical circuits. In fabricating electrical circuits as a series of conductive and insulating layers on a dielectric substrate, it is often necessary to make circuits including a number of conductive layers separated by insulating layers, but having some connections passing through the insulating layers to provide electrical connections between the conductive layers.

DESCRIPTION OF PRIOR ART

Conventionally, such circuits are made by forming a conductive pattern on a substrate and then covering it with a fluid layer having apertures where the connections are wanted. The fluid is then caused to set so that it forms an insulating layer having the required apertures. The apertures in the insulating layer are then filled with electrically conducting material. Another conductive pattern is then formed on the insulating layer. Connections are thus made between the two conductive patterns via the conductive material filling the aperture in the insulating layer. This is then repeated for each successive conducting layer.

It is generally desirable to pack such electrical circuits on to as small an area of substrate as is possible. A problem with this conventional method of making circuits is that in practice the connections through the dielectric layer have a minimum realisable size. This minimum size is determined by the physical properties of the fluid used to produce the insulating layer. This is because the insulating material must be fluid enough to be positioned on to a substrate and to then close up over any small imperfections which are initially present in the layer. The fluid must do this in order to prevent any unwanted gaps in the insulating layer remaining. Such gaps could act as shorts between the two conductive patterns found on either side of the insulating layer.

This invention was made whilst attempting to produce a method of forming an electrical circuit which avoids this problem.

BRIEF SUMMARY OF THE INVENTION

According to this invention a method of forming an electrical circuit arrangement including an electrically conductive link between adjacent layers of electrically conductive material which are spaced apart by intervening electrically insulating material, includes the steps of:

(i) forming on a first layer of conductive material a localised raised plug of a material which vapourises when heated, the plug being at the position where the link is to be formed;

(ii) forming a layer of fluid material over said first layer of conductive material;

(iii) heating the arrangement to vapourise the plug and to set the fluid material into a layer of insulating material;

(iv) filling the aperture in the insulating material vacated by the plug with conductive material to constitute said link; and (v) forming a second layer of conductive material over said layer of insulating material so as to be in contact with said link.

The plug prevents the layer of fluid material flowing into the aperture which is to be used to define the conductive link between the two conductive layers. Then, when the fluid is heated to set it, the plug vapourises, driving out any of the fluid material which may be present over the plug, such insulating material would otherwise prevent the conductive link being formed. The plug of ink vapourises completely and leaves an aperture through the insulation layer.

Advantageously an additional step is carried out between steps (ii) and (iii), this step being: forming a second plug on the first plug, the second plug being such that upon heating it will be completely vapourised.

This is advantageous because if any of the fluid is accidentally spread over the first plug, the addition of a second plug over this unwanted fluid makes the driving off of the unwanted fluid more certain when the plugs vapourise.

BRIEF DESCRIPTION OF SEVERAL VIEWS OF THE DRAWING

A method of making electrical circuits employing the invention will now be described with reference to the accompanying figures, in which.

DETAILED DESCRIPTION

Figure 1:
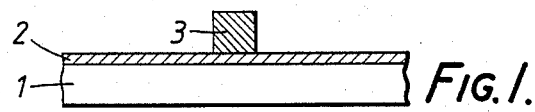
FIGS. 1 to 5 are explanatory diagrams showing schematically in cross-section how the method of the invention operates.
Figure 2:
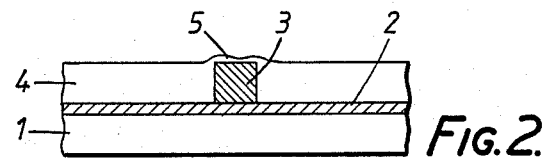
Figure 3:
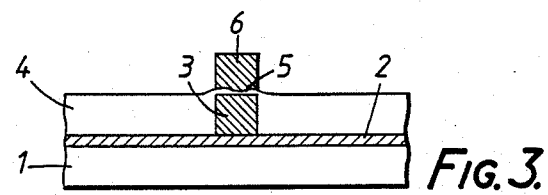
Figure 4:
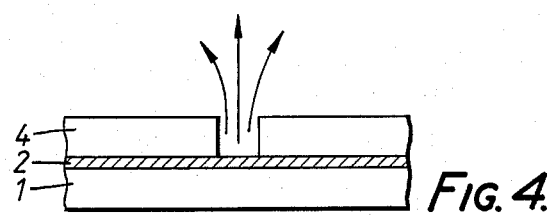
Figure 5:
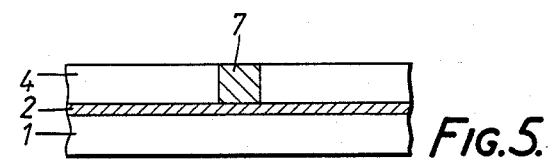
Figure 6:
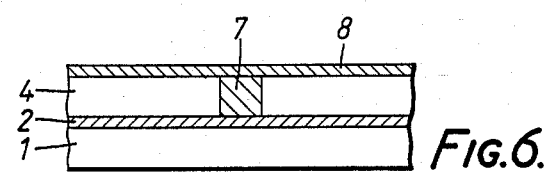
FIGS. 6 to 15 show schematically stages in the manufacture of a part of an electrical circuit, identical reference numerals being used for identical parts throughout.

Referring to FIG. 1, a cross section through an electrical circuit during manufacture shows a dielectric substrate 1 bearing a conductive layer 2 and a plug of ink 3. The plug of ink 3 being at a point where a conductive link through a dielectric layer will be required. A layer of dielectric ink 4 is then laid over the conductive layer 2. Ideally, none of the dielectric ink 4 should be laid down where the conductive link is required, but in practice some dielectric ink 5 will overlap on to this area and so be laid down on top of the plug of ink 3, see FIG. 2. Then a second plug of ink 6 is placed on top of the first plug of ink 3, as shown in FIG. 3. The dielectric ink 4 consists of two parts, non-volatile components which are left to form a dielectric layer when the circuit is fired and volatile components which vapourise when the circuit is fired. The plugs of ink 3 and 6 are formed entirely from the same chemicals as the volatile parts of the dielectric ink 4. Thus when the circuit is fired, as shown in FIG. 4, the two plugs of ink 6 and 3 vapourise, and the vapour drives off the dielectric ink 5 on the top of the plug of ink 3. The dielectric ink 4 is simultaneously caused, by firing, to form a solid state dielectric layer 4. Conductive material is then used to fill the aperture left in the dielectric ink 4 by the vapourisation of the plug 3, forming a conductive link 7, as shown in FIG. 5. A second conductive layer 8 is then laid down on the dielectric layer 4 as shown in FIG. 6. The first and second conductive layers 2 and 8 are thus electrically linked by the conductive link 7.

Although this process has been described with only one dielectric layer 4 being laid down, in order to prevent any flaws in the laying down of the ink causing shorts to occur between the conductive layers 2 and 8, it may be preferable to lay down a number of such layers on top of each other. If it is prefered to do this, separate plugs will be formed for each dielectric layer.

Figure 7:
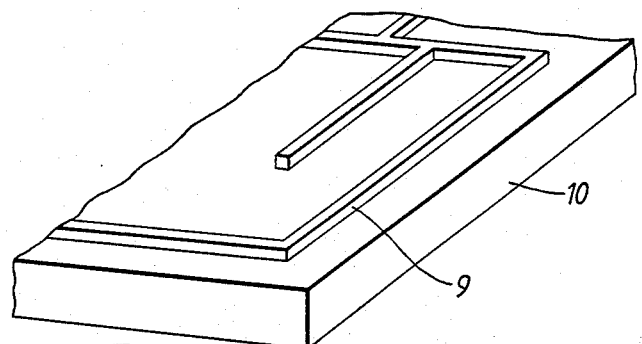
Figure 8:
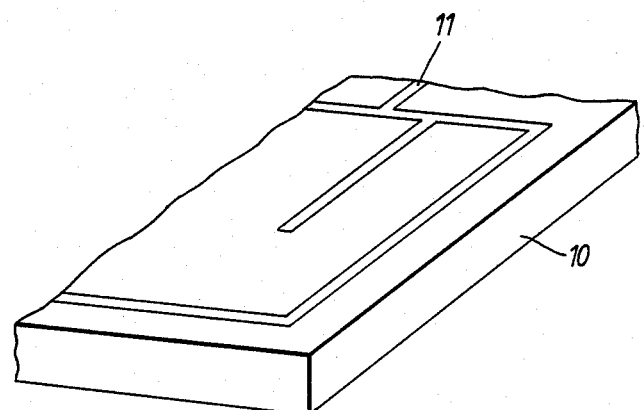
Figure 9:
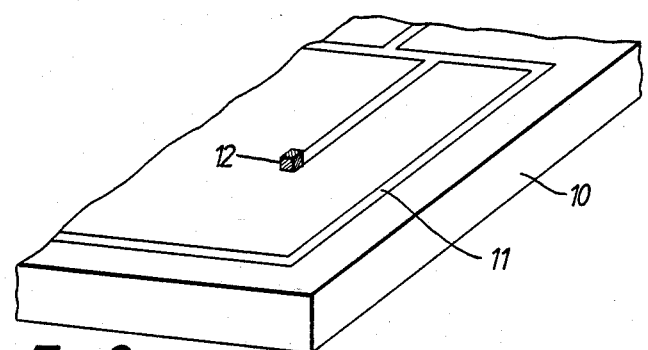

Referring to FIG. 7, in a more detailed method of manufacturing an electrical circuit, a metallic ink 9 is laid down in a pattern on to a dielectric substrate 10. This is then fired and the metallic particles in the ink fuse to produce a conductive layer 11 having the pattern of the ink as shown in FIG. 8, whilst the other components of the ink vapourise. A plug of ink 12 is then placed at a point where a conductive link will be wanted between the first conductive layer and a second conductive layer, see FIG. 9. This ink contains only volatile components, so that after firing it will leave no residue.

Figure 10:
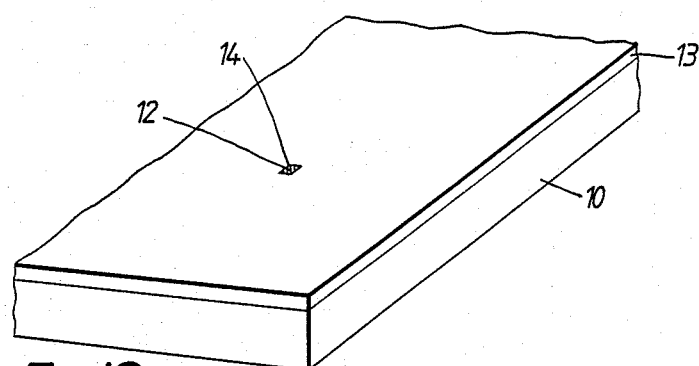

Then, as shown in FIG. 10, a layer of dielectric ink 13 is laid down over the conductive layer 11. A gap 14 is left in this layer of dielectric ink 13 where a conductive link is wanted, in order words at the position of the plug of ink 12. The plug of ink 12 prevents this gap 14 in the layer of dielectric ink 13 closing up due to the fluid properties of the dielectric ink 13.

Figure 11:
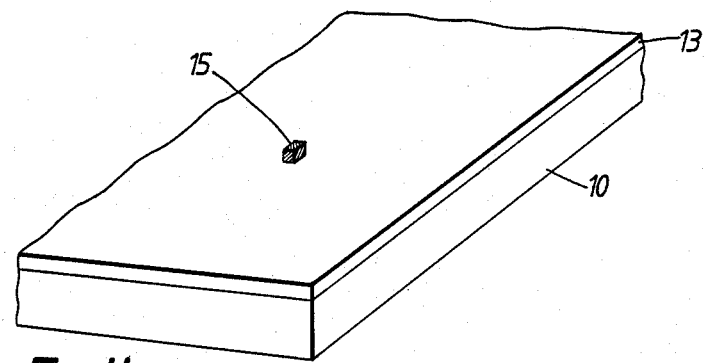
Figure 12:
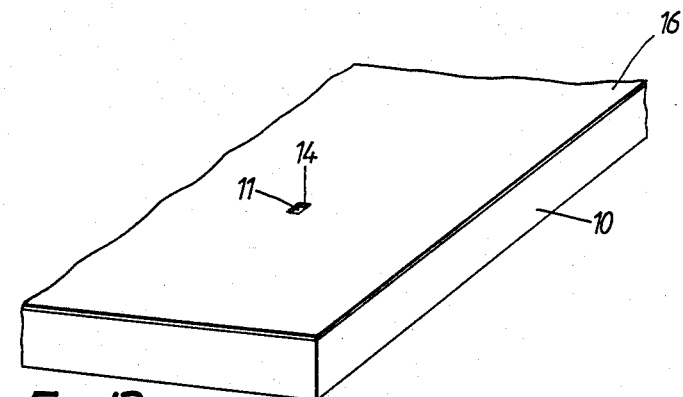

Then, as shown in FIG. 11 a second plug of ink 15 is placed on top of the first plug of ink 12. When the partially formed circuit is fired the two blocks of ink 12 and 15 vapourise. The vapour removes any of the dielectric ink 13 which is on top of the first plug of ink 12. While the plugs of ink 12 and 15 vapourise the volatile parts of the dielectric ink layer 13 are also vapourising, and by the time the plugs of ink 12 and 15 have completely vapourised the ink layer 13 is no longer fluid enough to flow into the gap 14 and close it up. After firing, the non-volatile parts of the dielectric ink 13 form a dielectric layer 16 having the gap 14 exposing a part of the conductive layer 11, see FIG. 12.

Figure 13:
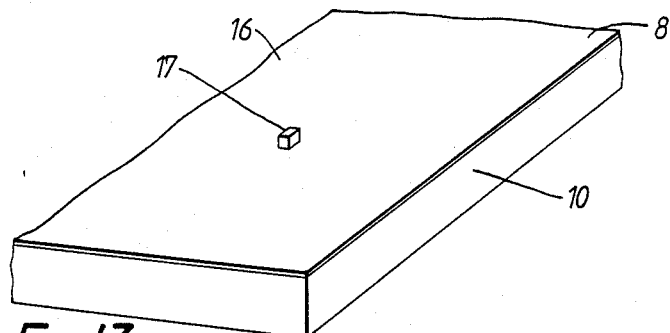

The conductive layer 11 is, of course, at a lower level than the dielectric layer 16. The gap 14 must be filled with conductive material, so conductive ink 17 is placed in the gap 14, see FIG. 13.

Figure 14:
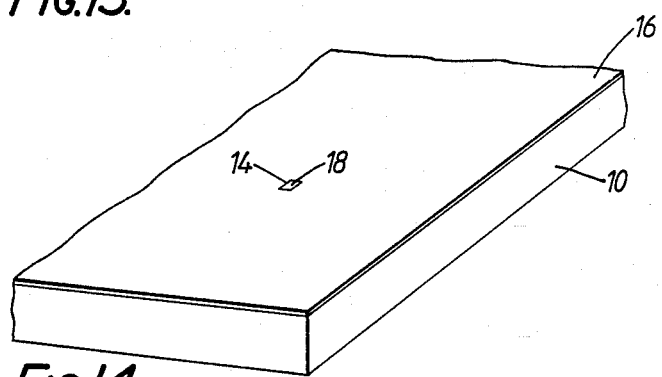

This is then fired and the conductive material in the conductive ink 17 is left, filling the gap 14 up to the level of the top of the dielectric layer 16. This forms a conductive link 18, as shown in FIG. 14.

Figure 15:
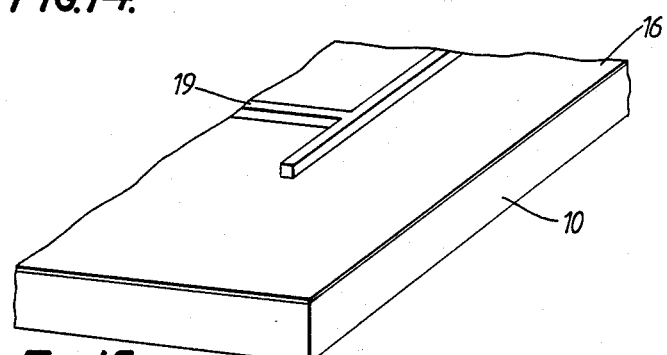
Figure 16:
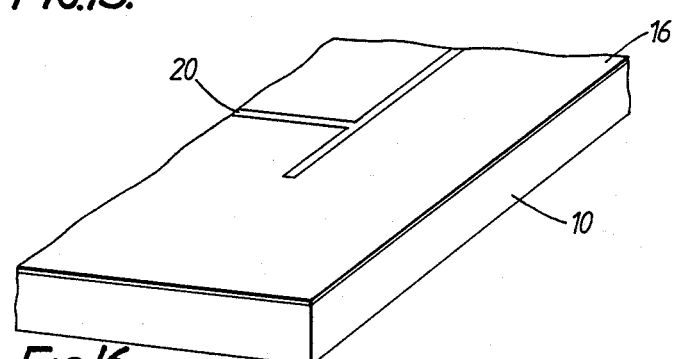

A second pattern of metallic ink 19 is then laid down on top of the dielectric layer 16, part of it making contact with the conductive link 18, as shown in FIG. 15. This is fired and the metallic ink 19 forms a conductive layer 20 having a pattern contacting the conductive layer 11 via the conductive link 18, as shown in FIG. 16.

As in the previous example it may be preferred to form the dielectric layer 16 from a series of thin dielectric layers, if so, separate plugs of ink will be laid down for each such layer.

Although the process has been described with reference to only one conductive link, in practice a large number would be simultaneously produced. The process can also be easily extended to include more than two conductive layers separated by dielectric layers on a substrate.

In the method described the plugs of ink were formed from the same material as the volatile parts of the dielectric ink, although this is generally convenient, the plugs could be formed of other materials.

I claim:

1. A method of forming an electrical circuit arrangement including: an electrically conductive link between adjacent layers of electrically conductive material which are spaced apart by intervening electrically insulating material, includes the steps of:
   (i) forming on a first layer of conductive material a localized raised plug of a material which vaporizes when heated, the plug being at the position where the link is to be formed;
   (ii) forming a layer of fluid material over said first layer of conductive material;
   (iii) heating the arrangement to vaporize the plug and to set the fluid material into a layer of insulating material with an aperture in the area vacated by the plug;
   (iv) filling the aperture in the insulating material vacated by the plug with conductive material to constitute said link; and
   (v) forming a second layer of conductive material over said layer of insulating material so as to be in contact with said link.

2. A method of forming an electrical circuit arrangement as claimed in claim 1, and including an additional step between step (ii) and step (iii), this step being:
   (vi) forming a second plug of material on the first plug of material the second plug of material being such that upon heating it will be completely vapourised.

3. A method of forming an electrical circuit arrangement as claimed in claim 1 in which a plurality of conductive links are similtaneously formed.

4. A method of forming an electrical circuit arrangement as claimed in claim 2 in which a plurality of conductive links are simultaneously formed.

5. A method of forming an electrical circuit arrangement as claimed in claim 1 in which more than two conductive layers separated by insulating layers are formed, the conductive layers being connected by one or more conductive links through the insulating layers.

6. A method of forming an electrical circuit arrangement as claimed in claim 2 in which more than two conductive layers separated by insulating layers are formed, the conductive layers being connected by one or more conductive links through the insulating layers.

7. A method of forming an electrical circuit arrangement as claimed in claim 1 in which each insulating layer is formed by laying down an ink comprising insulating material dispersed in a fluid binding medium so that when the ink is fired the binding medium is vapourised and the insulating material forms an insulating layer.

8. A method of forming an electrical circuit arrangement as claimed in claim 2 in which each insulating layer is formed by laying down an ink comprising insulating material dispersed in a fluid binding medium so that when the ink is fired the binding medium is vapourised and the insulating material forms an insulating layer.

9. A method of forming an electrical circuit as claimed in claim 7 in which the binding medium in which insulating material is dispersed and each plug are the same material.

10. A method of forming an electrical circuit as claimed in claim 8 in which the binding medium in which insulating material is dispersed and the each plug are the same material.

11. A method of forming an electrical circuit arangement as claimed in claim 1 in which all of the inks used are laid down by a screen printing process.

* * * * *